(12) United States Patent
Sato

(10) Patent No.: US 11,804,400 B2
(45) Date of Patent: Oct. 31, 2023

(54) SUBSTRATE PROCESSING APPARATUS

(71) Applicant: Tokyo Electron Limited, Tokyo (JP)

(72) Inventor: Mitsuaki Sato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 17/184,792

(22) Filed: Feb. 25, 2021

(65) Prior Publication Data

US 2021/0280450 A1  Sep. 9, 2021

(30) Foreign Application Priority Data

Mar. 9, 2020 (JP) .................................. 2020-039925

(51) Int. Cl.
*H01L 21/687* (2006.01)
*H01J 37/32* (2006.01)
(52) U.S. Cl.
CPC .... *H01L 21/68757* (2013.01); *H01J 37/3244* (2013.01); *H01J 37/32082* (2013.01); *H01J 37/32715* (2013.01); *H01J 37/32724* (2013.01); *H01L 21/68785* (2013.01)
(58) Field of Classification Search
CPC ......... H01L 21/68757; H01L 21/68785; H01L 21/6833; H01J 37/32082; H01J 37/3244; H01J 37/32715; H01J 37/32724; H01J 37/32449; H01J 37/32623; C23C 16/45521; C23C 16/4586; C23C 16/466
See application file for complete search history.

(56) References Cited

U.S. PATENT DOCUMENTS

| | | | | |
|---|---|---|---|---|
| 4,496,423 | A * | 1/1985 | Walton ................ | H01J 37/3244 438/935 |
| 6,500,299 | B1 * | 12/2002 | Mett ..................... | C23C 16/455 118/728 |
| 8,503,151 | B2 | 8/2013 | Comendant | |
| 2005/0011456 | A1 * | 1/2005 | Himori ............... | H01L 21/6831 118/724 |
| 2009/0283976 | A1 * | 11/2009 | Kaneko ............ | H01L 21/67103 279/142 |

(Continued)

FOREIGN PATENT DOCUMENTS

KR    20080004115 A  *  1/2008 .......... H01J 37/3244

OTHER PUBLICATIONS

English Machine Translation of Kim et al. (KR20080004115A) retrieved from ESPACENET on Mar. 7, 2023 (Year: 2023).*

(Continued)

*Primary Examiner* — Ram N Kackar
*Assistant Examiner* — Laureen Chan
(74) *Attorney, Agent, or Firm* — IPUSA, PLLC

(57) ABSTRACT

A substrate processing apparatus that includes a chamber, a substrate support disposed in the chamber, and a connection is provided. The chamber is provided with a bottom including a first flow path, and the substrate support includes a second flow path. The connection connects the first flow path to the second flow path, and the connection includes a sleeve through which the first flow path is in fluid communication with the second flow path, and a core including a first rod segment and a first elastic foam segment. The core is disposed in the sleeve, and a gap is defined between an inner surface of the sleeve and a side surface of the first rod segment.

9 Claims, 3 Drawing Sheets

(56) References Cited

U.S. PATENT DOCUMENTS

2017/0101713 A1* 4/2017 Wang ................ C23C 16/45565
2019/0252231 A1* 8/2019 Takasaki ............. H01L 21/6831

OTHER PUBLICATIONS

Tomsic, Joan L.. (2000). Dictionary of Materials and Testing (2nd Edition)—operational readiness. SAE International. Retrieved from https://app.knovel.com/hotlink/pdf/id:kt008646H1/dictionary-materials/operational-readiness (Year: 2000).*

MatWeb Plastic Material Data sheets Table 2. Material Properties (Metric Units). Retrieved from https://app.knovel.com/hotlink/itble/rcid:kpPMDS0001/id:kt0120A312/matweb-plastic-material/table-2-material-properties (Year: 2022).*

MatWeb Composite Material Data sheet (2010) Table 2. Material Properties (Metric Units). Retrieved from https://app.knovel.com/hotlink/itble/rcid:kpCMDS0005/id:kt012UTJN1/matweb-composite-material/table-2-material-properties (Year: 2010).*

Barron, Randall F. Barron, Brian R.. (2012). Design for Thermal Stresses—References. John Wiley & Sons. Table C-7 material properties of Teflon Retrieved from https://app.knovel.com/hotlink/pdf/id:kt011J0T81/design-thermal-stresses/properties-references (Year: 2012).*

* cited by examiner

SUBSTRATE PROCESSING APPARATUS

CROSS-REFERENCE TO RELATED APPLICATIONS

This patent application is based upon and claims priority to Japanese Patent Application No. 2020-039925 filed on Mar. 9, 2020, the entire contents of which are incorporated herein by reference.

TECHNICAL FIELD

The present disclosure relates to a substrate processing apparatus.

BACKGROUND

A substrate processing apparatus that supplies a heat transfer gas such as He gas, between the top surface of a substrate support and the back surface of a substrate is known, in order to increase thermal conductivity between the substrate and the substrate support.

Patent Document 1 describes a helium feed line for supplying helium gas to an electrostatic chuck, in which an insulating member having spiral grooves is disposed within a cavity of a cylinder formed of an insulating material.

RELATED ART DOCUMENT

Patent Document

[Patent Document 1] U.S. Pat. No. 8,503,151

SUMMARY

In one aspect, the present disclosure describes a substrate processing apparatus that suppresses generation of electrical discharge.

In order to solve the above-described problem, according to one aspect, a substrate processing apparatus that includes a chamber, a substrate support disposed in the chamber, and a connection is provided. The chamber is provided with a bottom including a first flow path, and the substrate support includes a second flow path. The connection is connected to the first flow path and the second flow path, and the connection includes a sleeve through which the first flow path is in fluid communication with the second flow path, and a core including a first rod segment and a first elastic foam segment. The core is disposed in the sleeve, and a gap is defined between an inner surface of the sleeve and a side surface of the first rod segment.

DETAILED DESCRIPTION OF EMBODIMENTS

In the following, embodiments for carrying out the present disclosure will be described with reference to the drawings. In each drawing, the same reference symbols are assigned to elements having identical features, and duplicating descriptions may be omitted.

<Substrate Processing Apparatus>

Figure 1:
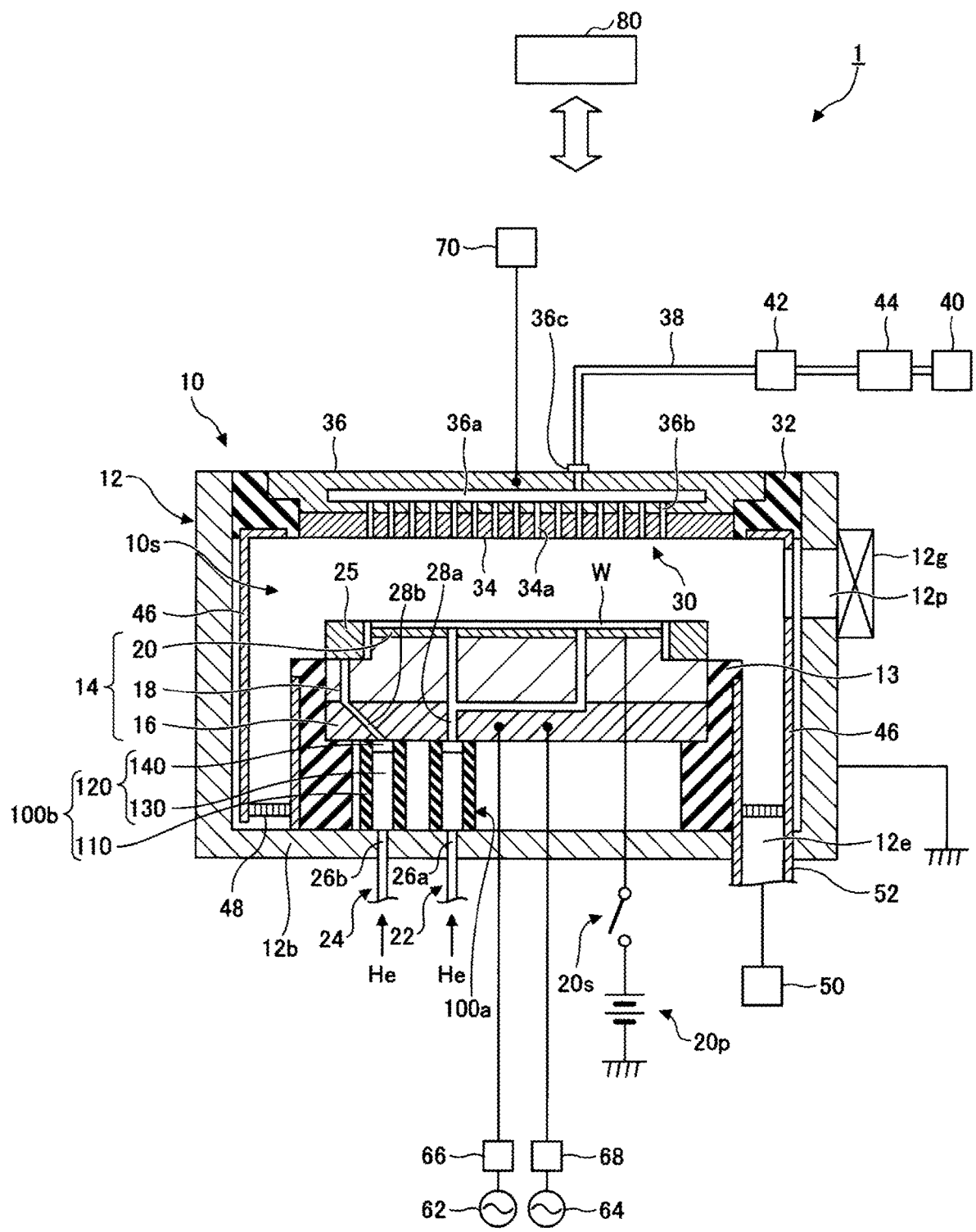
FIG. 1 is a cross-sectional view illustrating an example of a substrate processing apparatus according to an embodiment.

A substrate processing apparatus 1 according to an embodiment will be described with reference to FIG. 1. FIG. 1 is a cross-sectional view illustrating an example of the substrate processing apparatus 1 according to the present embodiment.

The substrate processing apparatus 1 includes a chamber 10. The chamber 10 provides an interior space 10s therein. The chamber 10 includes a chamber body 12. The chamber body 12 has a generally cylindrical shape. The chamber body 12 is formed of, for example, aluminum. A corrosion resistant film is provided on the inner wall surface of the chamber body 12. The film may be formed of a ceramic such as aluminum oxide or yttrium oxide.

A passage 12p is formed in the side wall of the chamber body 12. A substrate W is transferred between the interior space 10s and the exterior of the chamber 10 through the passage 12p. The passage 12p is opened and closed by a gate valve 11g provided along the side wall of the chamber body 12.

A support 13 is provided on a base plate 12b which is the bottom of the chamber body 12. The support 13 is formed of an insulating material. The support 13 is generally cylindrical in shape. The support 13 extends upward from the bottom of the chamber body 12 in the interior space 10s. At the upper portion of the support 13, a substrate support 14 is disposed. The substrate support 14 is configured to support the substrate W in the interior space 10s.

The substrate support 14 includes a lower electrode 18 and an electrostatic chuck 20. The substrate support 14 may further include an electrode plate 16. The electrode plate 16 is formed of a conductor such as aluminum, and is generally disc-shaped. The lower electrode 18 is disposed on the electrode plate 16. The lower electrode 18 is formed of a conductor such as aluminum, and is generally disc-shaped. The lower electrode 18 is electrically connected to the electrode plate 16.

The electrostatic chuck 20 is provided on the lower electrode 18. A substrate W is placed on the top surface of the electrostatic chuck 20. The electrostatic chuck 20 has a body and an electrode. The body of the electrostatic chuck 20 is generally disc-shaped, and is formed of a dielectric material. The electrode of the electrostatic chuck 20 is a film-like electrode provided within the body of the electrostatic chuck 20. The electrode of the electrostatic chuck 20 is connected to a direct-current (DC) power supply 20p via a switch 20s. When voltage from the DC power supply 20p is applied to the electrode of the electrostatic chuck 20, electrostatic attracting force is generated between the electrostatic chuck 20 and the substrate W. By the electrostatic attractive force, the substrate W is held by the electrostatic chuck 20.

An edge ring 25 is disposed on a periphery of the lower electrode 18 to surround the edge of the substrate W. The edge ring 25 improves in-plane uniformity of plasma processing applied to the substrate W. The edge ring 25 may be formed of silicon, silicon carbide, quartz, or the like.

A flow passage (not illustrated) is provided within the lower electrode 18. A heat exchange medium (e.g., refrigerant) is supplied to the flow passage from a chiller unit (not illustrated) provided outside the chamber 10 through a pipe (not illustrated). The heat exchange medium supplied to the flow passage is returned to the chiller unit via another pipe. In the substrate processing apparatus 1, the temperature of the substrate W placed on the electrostatic chuck 20 is adjusted by heat exchange between the heat exchange medium and the lower electrode 18.

The substrate processing apparatus 1 is provided with a gas supply line 22. The gas supply line 22 supplies a heat transfer gas (e.g., He gas) from a heat transfer gas supply mechanism to a gap between the top surface of the electrostatic chuck 20 and the back surface of the substrate W. A gas supply line 24 supplies a heat transfer gas (e.g., He gas) from the heat transfer gas supply mechanism to a gap between the top surface of the lower electrode 18 and the back surface of the edge ring 25.

The substrate processing apparatus 1 further includes an upper electrode 30. The upper electrode 30 is provided above the substrate support 14. The upper electrode 30 is supported on the top of the chamber body 12 via a member 32. The member 32 is formed of an insulating material. The upper electrode 30 and the member 32 occlude the top opening of the chamber body 12.

The upper electrode 30 may include a top plate 34 and a support 36. The bottom surface of the top plate 34 is exposed to the interior space 10s, and defines the interior space 10s. The top plate 34 may be formed of a low resistance conductor or semiconductor with low Joule heat generation. The top plate 34 has multiple gas discharge holes 34a penetrating the top plate 34 in a thickness direction of the top plate 34.

The support 36 removably supports the top plate 34. The support 36 is formed of an electrically conductive material such as aluminum. Within the support 36, a gas diffusion chamber 36a is provided. The support 36 has multiple gas holes 36b extending downward from the gas diffusion chamber 36a. The multiple gas holes 36b communicate with the multiple gas discharge holes 34a, respectively. A gas inlet 36c is formed in the support 36. The gas inlet 36c is connected to the gas diffusion chamber 36a. A gas supply line 38 is connected to the gas inlet 36c.

Valves 42, flow controllers 44, and gas sources 40 are connected to the gas supply line 38. The gas sources 40, the valves 42, and the flow controllers 44 constitute a gas supply section. Each of the valves 42 may be an open/close valve. Each of the flow controllers 44 is a mass flow controller or a pressure-controlled flow controller. Each of the gas sources 40 is connected to the gas supply line 38 via a corresponding open/close valve of the valves 42 and a corresponding flow controller of the flow controllers 44.

In the substrate processing apparatus 1, a shield 46 is removably provided along the inner wall surface of the chamber body 12 and the outer wall of the support 13. The shield 46 prevents reaction by-products from adhering to the chamber body 12. The shield 46 is constructed by, for example, forming a corrosion resistant film on the surface of a member formed of aluminum. The corrosion resistant film may be made from a ceramic such as yttrium oxide.

A baffle plate 48 is provided between the outer side wall of the support 13 and the inner side wall of the chamber body 12. The baffle plate 48 is constructed by, for example, forming a corrosion-resistant film (a film such as yttrium oxide) on the surface of a member formed of aluminum. Multiple through-holes are formed in the baffle plate 48. An exhaust port 12e is provided below the baffle plate 48 and at the bottom of the chamber body 12. An exhaust device 50 is connected to the exhaust port 12e through an exhaust pipe 52. The exhaust device 50 includes a pressure regulating valve and a vacuum pump such as a turbomolecular pump.

The substrate processing apparatus 1 includes a first radio frequency power supply 62 and a second radio frequency power supply 64. The first radio frequency power supply 62 is a power source that generates first radio frequency (RF) power. The first RF power has a frequency suitable for generating a plasma. The frequency of the first RF power is, for example, a frequency in the range of 27 MHz to 100 MHz. The first radio frequency power supply 62 is connected to the lower electrode 18 via a matcher 66 and the electrode plate 16. The matcher 66 includes circuitry for causing the output impedance of the first radio frequency power supply 62 to match impedance of the load side (lower electrode 18 side). The first radio frequency power supply 62 may be connected to the upper electrode 30 via the matcher 66. The first radio frequency power supply 62 constitutes an example plasma generator.

The second radio frequency power supply 64 is a power source that generates second RF power. The second RF power has a frequency lower than the frequency of the first RF power. In a case in which the second RF power is used in conjunction with the first RF power, the second radio frequency power is used as RF power for biasing to draw ions into the substrate W. The frequency of the second RF power is, for example, a frequency in the range of 400 kHz to 13.56 MHz. The second radio frequency power supply 64 is connected to the lower electrode 18 via a matcher 68 and the electrode plate 16. The matcher 68 includes circuitry for causing the output impedance of the second radio frequency power supply 64 to match impedance of the load side (lower electrode 18 side).

It should be noted that a plasma may be generated using the second RF power, without using the first RF power. That is, a plasma may be generated using only single RF power. In such a case, the frequency of the second RF power may be greater than 13.56 MHz, for example 40 MHz. In this case, the substrate processing apparatus 1 may not include the first radio frequency power supply 62 and the matcher 66. The second radio frequency power supply 64 constitutes an example plasma generator.

In the substrate processing apparatus 1, a gas is supplied from the gas supply section to the interior space 10s to produce a plasma. Also, as the first RF power and/or the second RF power are supplied, a radio frequency electric field is generated between the upper electrode 30 and the lower electrode 18. The generated radio frequency electric field generates a plasma.

The substrate processing apparatus 1 includes a power supply 70. The power supply 70 is connected to the upper electrode 30. The power supply 70 applies voltage to the upper electrode 30 to draw positive ions that are present in the interior space 10s into the top plate 34.

The substrate processing apparatus 1 may further include a controller 80. The controller 80 may be a computer including a processor, a storage device such as a memory, an input device, a display device, an input/output interface of a signal, and the like. The controller 80 controls each part of the substrate processing apparatus 1. An operator can perform input operations of commands to manage the substrate processing apparatus 1, by using the input device of the controller 80. The controller 80 can also display an operation status of the substrate processing apparatus 1 on the display device. Further, a control program and recipe data are stored in the storage device. The control program is executed by the processor to cause the substrate processing apparatus 1 to perform various processes. The processor executes the control program, and controls each part of the substrate processing apparatus 1 in accordance with the recipe data.

Here, the gas supply lines 22 and 24 will be further described.

The base plate 12b is provided with gas flow paths 26a and 26b. The electrode plate 16 of the substrate support 14 is provided with gas flow paths 28a and 28b. The gas flow path 28a penetrates the electrode plate 16, the lower electrode 18, and the electrostatic chuck 20, and openings of the gas flow path 28a are provided on the electrostatic chuck 20, at locations where a substrate W is placed. The gas flow path 28b penetrates the electrode plate 16 and the lower electrode 18, and an opening of the gas flow path 28b is provided at a location where the edge ring 25 is mounted.

Joints (connections) 100a and 100b are provided between the electrode plate 16 to which RF power is applied and the base plate 12b which is grounded. The joint 100a connects the gas flow path 26a to the gas flow path 28a. The gas supply line 22 includes the gas flow path 26a, the joint 100a, and the gas flow path 28a. The joint 100b connects the gas flow path 26b to the gas flow path 28b. The gas supply line 24 includes the gas flow path 26b, the joint 100b, and the gas flow path 28b.

The structure of the joint 100a is similar to the structure of the joint 100b. Therefore, in the following description, the joint 100b of the gas supply line 24 will be mainly described, and the duplicating description of the joint 100a of the gas supply line 22 will be omitted.

Figure 2:
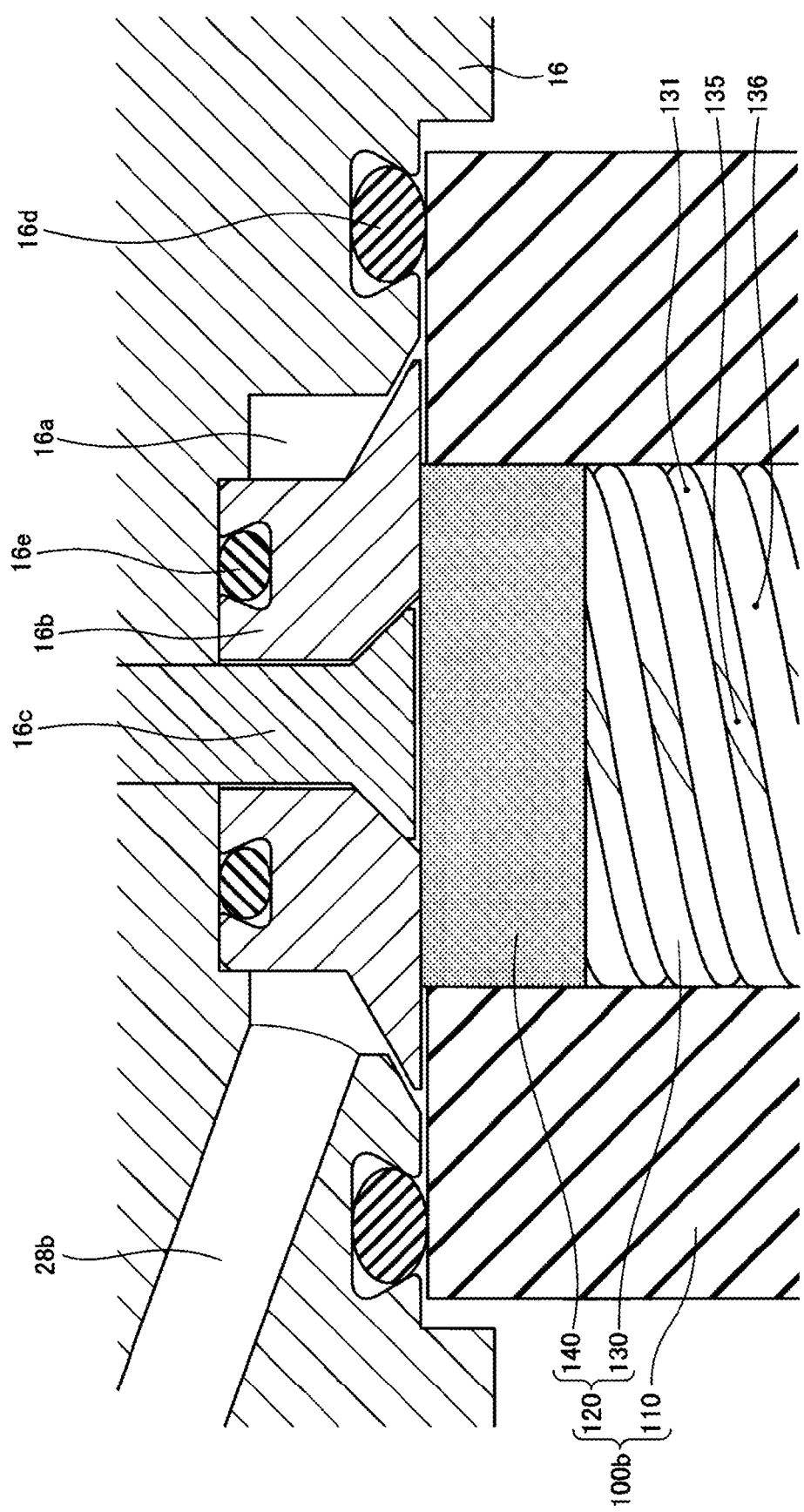
FIG. 2 is a partially enlarged cross-sectional view of the substrate processing apparatus according to the embodiment.

The joint 100b will be further described with reference to FIG. 2, while referring to FIG. 1 as well. FIG. 2 is an enlarged cross-sectional schematic view of the substrate processing apparatus 1 according to the embodiment, in which the vicinity of the upper portion of the joint 100b is illustrated in an enlarged form.

As illustrated in FIG. 2, a recess 16a is formed at the bottom surface of the electrode plate 16. The recess 16a communicates with the gas flow path 28b. A canceller 16b is disposed in the recess 16a. Similar to the electrode plate 16, the canceller 16b is formed of a conductor, such as aluminum. The canceller 16b is secured to the electrode plate 16 by a securing member 16c, so that electricity is conducted between the canceller 16b and the electrode plate 16. The bottom surface of the canceller 16b is substantially level with the bottom surface of the electrode plate 16.

The joint 100b has an outer cylinder 110 and a core 120 disposed within the outer cylinder 110. The outer cylinder 110 may also be referred to as a sleeve 110.

The outer cylinder (i.e., sleeve) 110 has a cylindrical shape. The sleeve 110 may be formed of an insulating material, such as a resin (e.g., polychlorotrifluoroethylene) and quartz. The upper end of the sleeve 110 is attached to the lower surface of the electrode plate 16 via a sealing member 16d. The lower end of the sleeve 110 is attached to the top surface of the base plate 12b via a sealing member. Thus, the gas flow path 26b of the base plate 12b is in fluid communication with the gas flow path 28b of the electrode plate 16 through the outer cylinder.

The core 120 includes a rod 130 and an elastic foam segment 140.

The rod 130 is formed of an insulating material, such as a resin (e.g., polychlorotrifluoroethylene) and quartz, similarly to the outer cylinder 110. A spiral groove is formed between the outer peripheral surface of the rod 130 and a portion of the inner peripheral surface of the outer cylinder 110 that faces the outer peripheral surface of the rod 130, and a heat transfer gas can pass through the spiral groove. In the example illustrated in FIG. 2, the spiral groove 131 is formed in the outer peripheral surface of the rod 130. In other words, the rod 130 has a core shaft 135 and a spiral flange 136.

A potential difference is caused between the electrode plate 16 and the base plate 12b. Therefore, in the joint 100b, gaps arranged in the axial direction of the joint 100b (e.g., a gap between the electrode plate 16 and the core 120, a spiral groove 131 within the flange 136 which is separated in the axial direction, and a gap between the base plate 12b and the core 120) can be regarded as capacitors. That is, the joint 100b disposed between the electrode plate 16 and the base plate 12b can be regarded as a set of capacitors arranged in series.

An amount of charge Q of a capacitor is expressed by the following equation (1) by using capacitance C and voltage V. Also, in a case in which the capacitor is regarded as a parallel-plate capacitor, its capacitance C is expressed by the following equation (2) using dielectric constant s, area S, and distance d between plates of the parallel-plate capacitor.

$$Q = CV \tag{1}$$

$$C = \varepsilon \frac{S}{d} \tag{2}$$

From the equations (1) and (2), the following equation (3) is derived.

$$V = \frac{Qd}{\varepsilon S} \tag{3}$$

Figure 3:
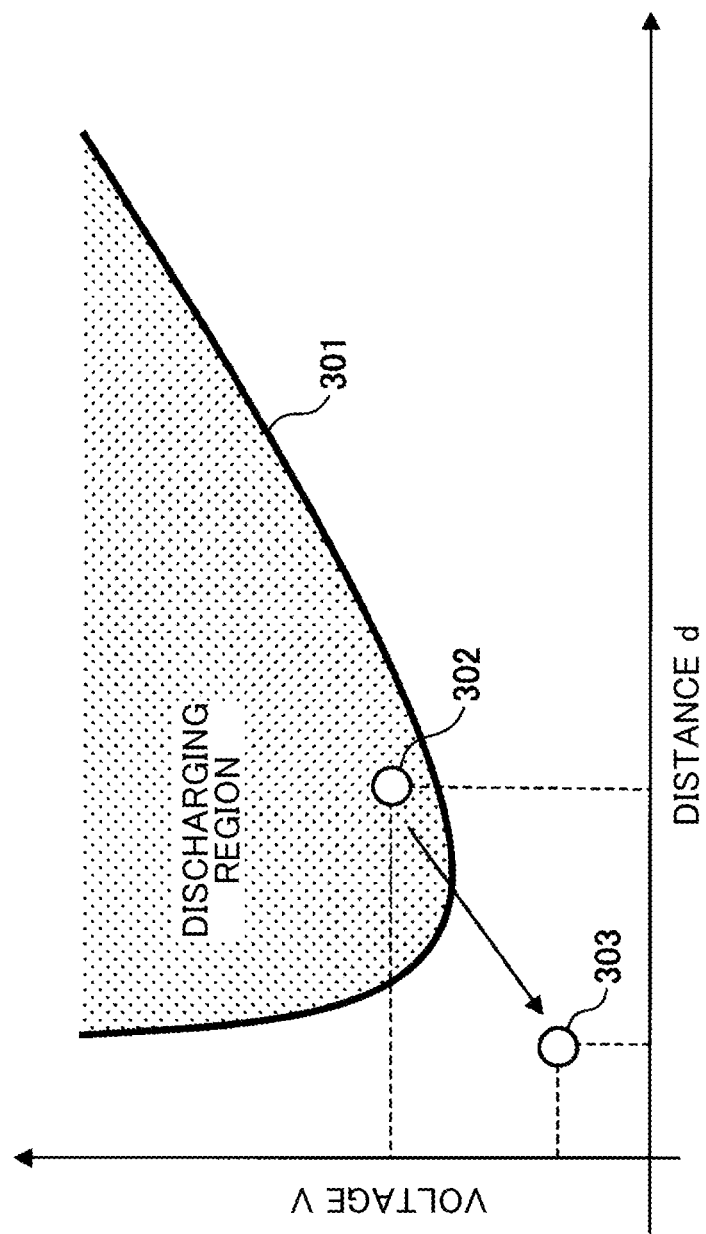
FIG. 3 is a graph illustrating an example of combinations of the distance between electrodes and the voltage between the electrodes, in terms of whether or not discharge occurs.

FIG. 3 is a graph illustrating an example of combinations of the distance d between electrodes and the voltage V between the electrodes, in terms of whether or not discharge occurs. Here, the following description assumes that a heat transfer gas (He gas) is filled between the electrodes and the pressure of the heat transfer gas is constant. In the graph of FIG. 3, the horizontal axis indicates the distance d between electrodes, and the vertical axis indicates the voltage V between the electrodes. The curve 301 in FIG. 3 illustrates breakdown voltage (Paschen Curve), which indicates the minimum voltage causing discharge. In a region above the curve 301 (discharging region), discharge occurs between the electrodes.

Here, as the equation (3) indicates, the voltage V can be reduced by reducing the distance d. That is, as the points 302 and 303 in FIG. 3 indicate, if the distance d indicated by the point 302 is narrowed to the point 303, the voltage V can be lowered relative to the breakdown voltage (curve 301), to prevent occurrence of discharge.

Thus, the rod 130 with the spiral groove 131 formed on the outer peripheral surface not only allows a heat transfer gas to flow, but also narrows the gap in the axial direction (corresponding to "d" in FIG. 3) to prevent discharge.

A spiral groove formed in the joint 100b is not limited thereto. A spiral groove may be formed on the outer peripheral surface of the rod 130 and/or on a portion of the inner peripheral surface of the outer cylinder 110 that faces the outer peripheral surface of the rod 130.

The elastic foam segment 140 is disposed between the electrode plate 16 and the rod 130.

The elastic foam segment 140 is made of an elastically deformable insulating material, such as fluororubber and vulcanized rubber. Specifically, the Young's modulus of the elastic foam segment 140 may preferably be equal to or greater than 1 MPa and equal to or less than 3 MPa. It is preferable that the hardness of the elastic foam segment 140 is equal to or greater than 20 and equal to or less than 90 in a type A durometer specified in JIS K6253. In addition, the thickness of the elastic foam segment 140 may preferably be equal to or greater than 5 mm.

The elastic foam segment 140 is also formed to allow a heat transfer gas to flow. Specifically, the elastic foam segment 140 may be foam. The elastic foam segment 140, which is foam, includes irregular open-cell foam, and is formed to allow a heat transfer gas to flow. The elastic foam segment 140 may be a labyrinth structure in which a gap through which a heat transfer gas passes is formed like a maze.

The elastic foam segment 140 is disposed between the upper end of the rod 130 and the bottom surface of the electrode plate 16. As the elastic foam segment 140 is deformed elastically, the lower portion of the elastic foam segment 140 contacts the upper end of the rod 130 and the upper portion of the elastic foam segment 140 contacts the lower surface of the electrode plate 16. This allows heat transfer gas to flow through the area from the upper end of the rod 130 to the bottom surface of the electrode plate 16, while narrowing the gap in the axial direction to prevent discharge. As the elastically deformed elastic foam segment 140 also presses the rod 130 toward the base plate 12b, the gap between the lower end of the rod 130 and the base plate 12b is narrowed and discharge is prevented.

In addition, as heat of the plasma generated in the interior space 10s of the chamber 10 enters the support 13 and the like, the support 13 and the like expand thermally. Accordingly, the distance from the base plate 12b to the electrode plate 16 varies. Also, as heat of the plasma that has entered the electrostatic chuck 20 or the electrode plate 16 is transferred to the rod 130, the rod 130 expands thermally. Meanwhile, because the joint 100b absorbs variations in distance from the base plate 12b to the electrode plate 16 and absorbs thermal expansion of the rod 130 caused by elastic deformation of the elastic foam segment 140, damage to the rod 130 or deformation of the rod 130 is prevented. Regarding the outer cylinder 110, the sealing member 16d between the upper end of the outer cylinder 110 and the lower surface of the electrode plate 16 and a sealing member (not illustrated) between the lower end of the outer cylinder 110 and the top surface of the base plate 12b can absorb variations in the distance from the base plate 12b to the electrode plate 16 or thermal expansion of the outer cylinder 110.

FIG. 1 illustrates the structure in which the rod 130 is disposed on the side of the base plate 12b and the elastic foam segment 140 is disposed on the side of the electrode plate 16. However, a structure of the core 120 is not limited to the above-described structure. The elastic foam segment 140 may be disposed on the side of the base plate 12b and the rod 130 may be disposed on the side of the electrode plate 16. In another embodiment, one elastic foam segment 140 may be disposed on the side of the base plate 12b, another elastic foam segment 140 may be disposed on the side of the electrode plate 16, and the rod 130 may be disposed between these two elastic foam segments 140. In yet another embodiment, one rod 130 may be disposed on the side of the base plate 12b, another rod 130 may be disposed on the side of the electrode plate 16, and an elastic foam segment 140 may be disposed between these two rods 130. That is, the core 120 may include at least one rod 130 and at least one elastic foam segment 140, and the rod 130 and the elastic foam segment 140 may be arranged along the axial direction of the outer cylinder 110.

Although the embodiments of the substrate processing apparatus 1 have been described, the present disclosure is not limited to the above-described embodiments. Various modifications and enhancements can be made within the scope of the gist of the present disclosure as described in the claims.

What is claimed is:

1. A substrate processing apparatus comprising:
    a chamber including a bottom including a first flow path;
    a substrate support disposed in the chamber, the substrate support including a second flow path; and
    a connection disposed between the bottom of the chamber and the substrate support, the connection being connected to the first flow path and the second flow path, the connection including
        a sleeve through which the first flow path is in fluid communication with the second flow path, and
        a core disposed in the sleeve, the core including a first rod segment and a first elastic foam segment, a gap being defined between an inner surface of the sleeve and a side surface of the first rod segment,
    wherein a Young's modulus of the first elastic foam segment is greater than or equal to 1 MPa and less than or equal to 3 MPa.

2. The substrate processing apparatus according to claim 1, wherein the first elastic foam segment includes open-cell foam.

3. The substrate processing apparatus according to claim 1, wherein the gap is defined by a spiral groove provided on the side surface of the first rod segment.

4. The substrate processing apparatus according to claim 1, wherein the gap is defined by the inner surface of the sleeve in a region that faces the side surface of the first rod segment.

5. The substrate processing apparatus according to claim 1, wherein the first elastic foam segment is disposed between the first rod segment and the substrate support.

6. The substrate processing apparatus according to claim 1, wherein the first elastic foam segment is disposed between the first rod segment and the bottom of the chamber.

7. The substrate processing apparatus according to claim 1, wherein
    the core further includes a second elastic foam segment including open-cell foam; and
    the first elastic foam segment is disposed between the first rod segment and the bottom of the chamber while the second elastic foam segment is disposed between the first rod segment and the substrate support.

8. A substrate processing apparatus comprising:
    a chamber including a bottom including a first flow path,
    a substrate support disposed in the chamber, the substrate support including a second flow path, and
    a connection disposed between the bottom of the chamber and the substrate support, the connection being connected to the first flow path and the second flow path, the connection including
        a sleeve through which the first flow path is in fluid communication with the second flow path, and
        a core disposed in the sleeve, the core including a first rod segment and a first elastic foam segment, a gap being defined between an inner surface of the sleeve and a side surface of the first rod segment, wherein
        the core further comprises a second rod segment; and
        the first elastic foam segment is disposed between the first rod segment and the second rod segment.

9. The substrate processing apparatus according to claim 1, further comprising a radio-frequency (RF) power source to supply RF power to the substrate support.

* * * * *